United States Patent [19]
Gotou

[11] Patent Number: 5,808,338
[45] Date of Patent: Sep. 15, 1998

[54] NONVOLATILE SEMICONDUCTOR MEMORY

[75] Inventor: Hiroshi Gotou, Tokyo, Japan

[73] Assignee: NKK Corporation, Japan

[21] Appl. No.: 848,396

[22] Filed: May 8, 1997

Related U.S. Application Data

[63] Continuation of Ser. No. 555,076, Nov. 8, 1995, abandoned.

[30] Foreign Application Priority Data

Nov. 11, 1994 [JP] Japan .................................. 6-278170

[51] Int. Cl.$^6$ ................................................ H01L 29/788
[52] U.S. Cl. ...................... 257/315; 257/318; 365/185.25
[58] Field of Search .................................... 257/314, 315, 257/318; 365/185.01, 185.05, 185.1, 185.18, 185.28

[56] References Cited

U.S. PATENT DOCUMENTS

| | | | |
|---|---|---|---|
| 4,282,446 | 8/1981 | McElroy | 365/185.28 |
| 4,432,072 | 2/1984 | Chao et al. . | |
| 4,574,273 | 3/1986 | Atsumi et al. . | |
| 4,649,520 | 3/1987 | Eitan | 257/318 |
| 4,725,983 | 2/1988 | Terada | 365/185 |
| 4,797,856 | 1/1989 | Lee et al. | 365/185.21 |
| 4,811,292 | 3/1989 | Watanabe | 365/185.23 |
| 4,931,997 | 6/1990 | Mitsuishi et al. | 365/218 |
| 4,953,123 | 8/1990 | Takeuchi et al. | 365/66 |
| 4,958,317 | 9/1990 | Terada et al. | 365/185.08 |
| 5,068,827 | 11/1991 | Yamada et al. | 365/185.19 |
| 5,075,888 | 12/1991 | Yamauchi et al. | 365/185.08 |

(List continued on next page.)

FOREIGN PATENT DOCUMENTS

| | | |
|---|---|---|
| 0 106 681 | 4/1984 | European Pat. Off. . |
| 53-46621 | 12/1978 | Japan . |
| 62-266793 | 11/1987 | Japan . |
| 2-166764 | 6/1990 | Japan . |
| 4-105368 | 4/1992 | Japan . |
| 4-155694 | 5/1992 | Japan . |
| 5-189988 | 7/1993 | Japan . |

OTHER PUBLICATIONS

Abstract Pub. No.: 02–166764 JP 2166764 A Semiconductor Device with Capacitance Element and Manufacture Thereof.
Abstract Pub. No. 04–105368 JP 4105368 A April, 1992 Natsuo et al Nonvolatile Semiconductor Storage Device.
Abstract Pub No. 05–189988 A JP 5189988 A Semiconductor Memory Device.
Abstract Pub No. 62–266793 JP 62266793 A Yasushi et al Nonvolatile Semiconductor Storage Device.
Patent Abstracts of Japan, vol. 16, No. 445 (P–1422), Sep. 17, 1992 & JP–A–04 155694 (Fujitsu Ltd), May 28, 1992.
International Electron Devices Meeting, Dec. 8, 1980, Washington, US, pp. 602–606, Kupec et al., "Triple level polysilicon E2PROM with single transistor per bit".
M. Lanzoni et al., "A Novel Approach to Controlled Programming of Tunnel–Based Floating–Gate MOSFET's," *IEEE Journal of Solid–State Circuits*, vol. 29, No. 2, Feb. 1994, pp. 147–150.
Hiroshi Gotou, "New Operation Mode for Stacked–Gate Flash Memory Cell," *IEEE Electron Devices Letters*, vol. 16, No. 3, Mar. 1995, pp. 121–123.

*Primary Examiner*—David B. Hardy
*Attorney, Agent, or Firm*—Nixon & Vanderhye

[57] ABSTRACT

An N well and an n-type ground wiring layer are formed in a P-substrate by diffusion. A word line consisting of p-type polysilicon is formed in the N well. The drain and source regions of a memory cell transistor are formed near the N well by ion-implanting arsenic into the P-substrate. A continuous floating gate is formed on the channel region between the drain and source regions and the word line region through a predetermined gap. The p-type silicon portion opposing this floating gate serves as the control gate of the memory cell transistor. When a pulse alternately and repeatedly having potentials of +3 V and –10 V is applied to the word line, the thresholds of the corresponding memory cell transistors converge to a value corresponding to +3 V of the pulse.

15 Claims, 10 Drawing Sheets

U.S. PATENT DOCUMENTS

| | | | |
|---|---|---|---|
| 5,126,808 | 6/1992 | Montalvo et al. | 365/185.09 |
| 5,126,969 | 6/1992 | Kawana | 365/185.08 |
| 5,132,935 | 7/1992 | Ashmore, Jr. | 365/185.19 |
| 5,179,536 | 1/1993 | Kasa et al. | 365/200 |
| 5,278,794 | 1/1994 | Tanaka et al. | 365/185.13 |
| 5,282,161 | 1/1994 | Villa | 257/314 |
| 5,283,758 | 2/1994 | Nakayama et al. | 365/185.26 |
| 5,307,312 | 4/1994 | Maurelli et al. | 257/314 |
| 5,327,385 | 7/1994 | Oyama | 365/185.24 |
| 5,402,373 | 3/1995 | Aritome et al. | 365/185.14 |
| 5,406,521 | 4/1995 | Hara | 365/185.29 |
| 5,491,656 | 2/1996 | Sawada | 365/185.29 |
| 5,501,996 | 3/1996 | Yang et al. | 437/43 |
| 5,545,906 | 8/1996 | Ogura et al. | 257/315 |
| 5,602,779 | 2/1997 | Gotou | 365/185.23 |
| 5,615,146 | 3/1997 | Gotou | 365/185.1 |
| 5,623,442 | 4/1997 | Gotou et al. | 365/185.08 |
| 5,661,686 | 8/1997 | Gotou | 365/185.23 |

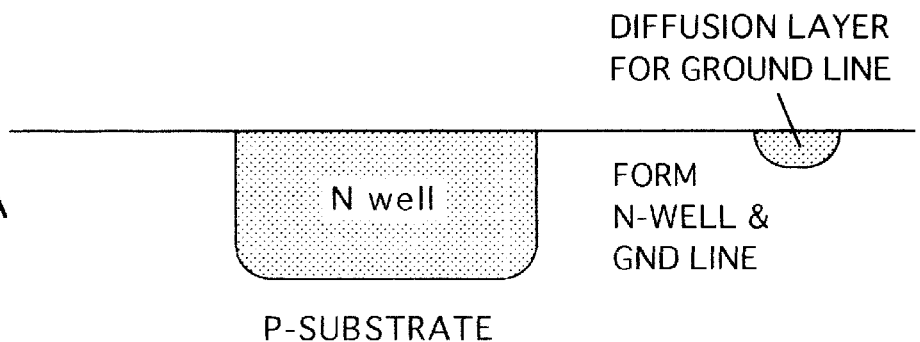
FIG. 9A  FORM N-WELL & GND LINE
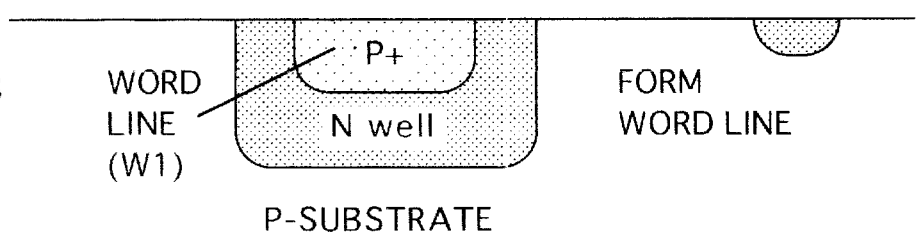
FIG. 9B  FORM WORD LINE
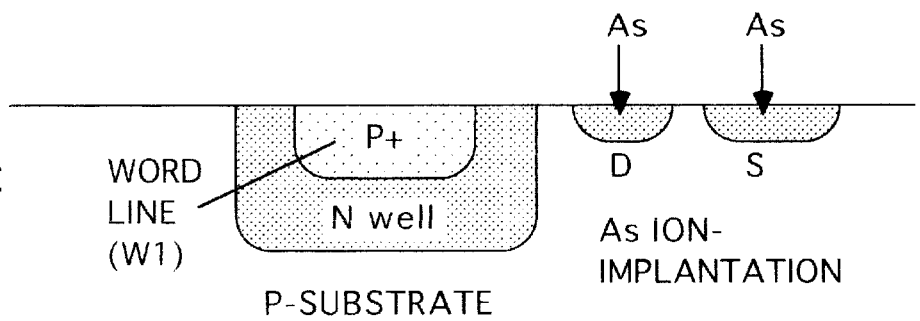
FIG. 9C  As ION-IMPLANTATION
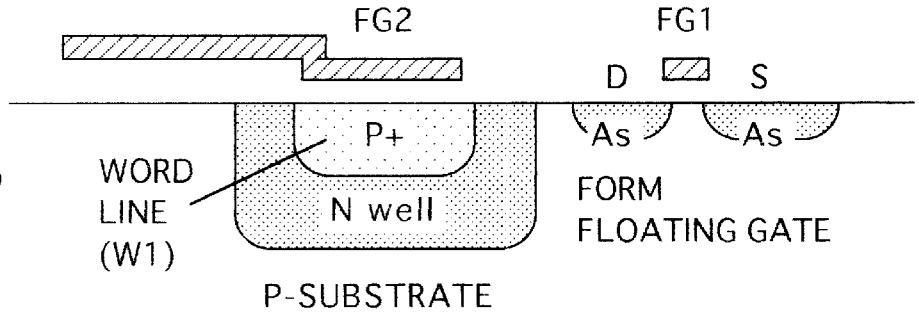
FIG. 9D  FORM FLOATING GATE

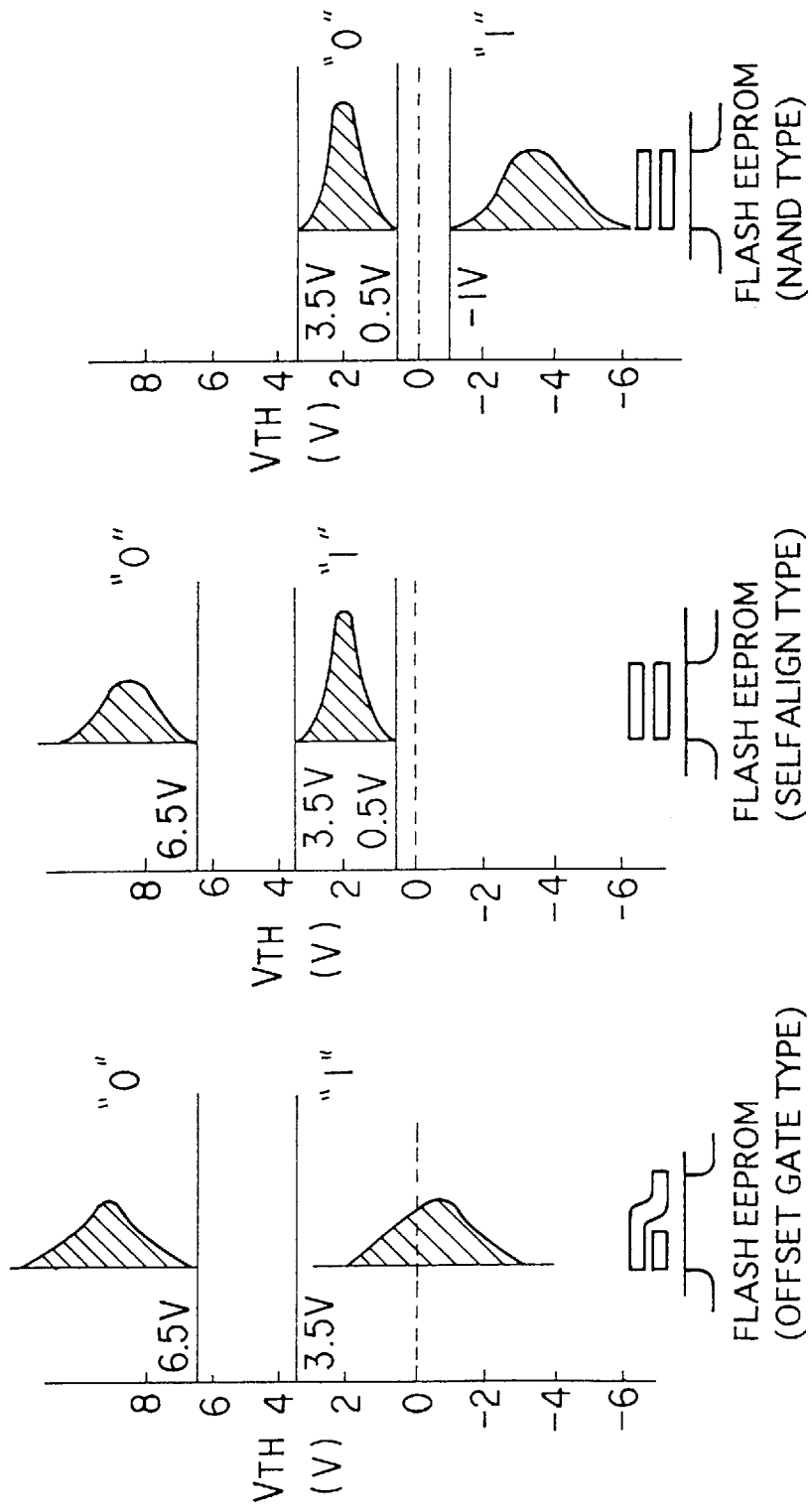

NONVOLATILE SEMICONDUCTOR MEMORY

This is a continuation of application Ser. No. 08/555,076, filed 8 Nov. 1995, now abandoned.

BACKGROUND OF THE INVENTION

1. Field of the Invention

The present invention relates to a nonvolatile semiconductor memory (EEPROM) capable of electrically rewriting/erasing information.

2. Description of the Related Art

The stored information rewrite operations of nonvolatile semiconductor memories are roughly classified into operations performed by a scheme (1) of writing information with hot electrons and erasing information with a tunnel current and operations performed by a scheme (2) of writing information with a tunnel current and erasing information with a tunnel current.

A flash EEPROM is a typical example of the nonvolatile semiconductor memory using the former scheme (1). In the flash EEPROM, information is written by applying a write voltage (high voltage Vpp) to both the control gate and drain electrode of a MOS transistor constituting a memory cell and injecting hot electrons into the floating gate.

In such an EEPROM, the threshold of a memory cell transistor changes with a change in the channel length of a MOS transistor for a memory cell, the thickness of the tunnel current passage insulating film (the thickness of the tunnel oxide film) under the floating gate, the electrode voltage between the source and the drain, or the like. As a result, the distribution (data "0") of threshold voltage VTH after information is written in each memory cell transistor greatly varies, as indicated by the hatched upper distribution in FIG. 11A or 11B.

In an erase operation, the control gate of a MOS transistor for a memory cell is grounded, and an erase voltage (Vpp) is applied to the source electrode (or the drain electrode), thereby extracting the electrons trapped in the floating gate to the source electrode (or the drain electrode) in the form of a tunnel current. In this erase operation as well, the distribution (data "1") of threshold voltage VTH of the memory cell after the information is erased is dependent on variations in the voltage (word line voltage) of the control gate, the drain voltage (or the bit line voltage), the thickness of the tunnel oxide film, or the like, and hence greatly varies, as indicated by the hatched lower distribution in FIG. 11A or 11B.

A NAND type EEPROM is a typical example of the nonvolatile semiconductor memory using the latter scheme (2). In the NAND type EEPROM, information is written or erased with a tunnel current from the floating gate of a MOS transistor constituting a memory cell.

The tunnel current used in the scheme (2) varies depending on variations in word line voltage (control gate voltage), bit line voltage (drain voltage), or the thickness of a tunnel oxide film, as in the erase operation performed by the scheme (1) described above. For this reason, in the scheme (2) as well, the distribution of threshold voltage VTH of a memory cell transistor in a write/erase operation greatly varies, as indicated by the hatched upper/lower distribution in FIG. 11C.

For example, in the case shown in FIG. 11B, of the variations in threshold voltage VTH, since variations on the upper voltage side (data "0" write operation) are distributed on the side higher than the read voltage (+5 V of TTL level) of the EEPROM, no significant problem is posed. However, since variations in threshold voltage VTH on the lower voltage side (data "1" erase operation) are distributed on the side lower than the read voltage (+5 V of TTL level) of the EEPROM, a data read operation is greatly influenced by the variations.

More specifically, if threshold voltage VTH (in particular, a threshold set after the electrons in the floating gate are extracted in an erase operation) of a memory cell transistor constituting the EEPROM greatly varies as described above, it is possible not to perform an information read operation based on a predetermined threshold voltage.

In order to prevent such an inconvenience, the write/erase time may be changed for each memory cell transistor (bit) to make threshold voltage VTH fall within a predetermined range. For this operation, however, the EEPROM requires a circuit for detecting and correcting the written/erased state of each memory cell transistor. This circuit has a complicated arrangement, and a semiconductor pellet incorporated in the EEPROM increases in area accordingly (first drawback).

In addition, if the write/erase time is changed for each bit to make the threshold voltage of each memory cell transistor fall within the predetermined range, the time required to complete a write/erase operation is prolonged with an increase in the number of bits (second drawback).

In the write/erase operation of a batch erase type flash EEPROM, in order to prevent some cells from being over-erased, the following technique is generally employed. Charges are stored first in the floating gates of a plurality of memory cell transistors in advance to write data "0" therein, and the charges stored in the floating gates of the memory cells are then removed altogether. In this technique, however, a complicated erase operation is required (third drawback).

SUMMARY OF THE INVENTION

The present invention has been made in consideration of the above situation, and has as its first object to provide, with a relatively small number of steps in a manufacturing process, a nonvolatile semiconductor memory having a structure which suppresses variations in threshold of a plurality of memory cell transistors constituting an information storage portion, and can reliably erase information stored in a memory cell transistor without causing an over-erased state.

It is the second object of the present invention to provide a method of manufacturing a nonvolatile semiconductor memory which can achieve the first object.

A nonvolatile semiconductor memory of the present invention is characterized by its memory cell structure. More specifically, a control gate connected to a word line and the channel region of a memory cell transistor are formed parallel along a surface of a semiconductor substrate, and a floating gate for storing information is formed on the word line and the channel region through a predetermined gap.

In a nonvolatile semiconductor memory of the present invention associated with the first object, a word line drive signal (WDP) unique to the present invention is supplied to a word line to which the control gate of a memory cell transistor is connected. This word line drive signal (WDP) has an oscillating waveform (typically AC waveform). More specifically, the potential of this signal alternately and repeatedly oscillates a predetermined number of times (e.g., 10 times) between one potential (e.g., +3 V) corresponding to a desired threshold (e.g., +2.5 V) for a target memory cell transistor and the other potential (e.g., −10 V) for extracting charges stored in the floating gate of the target memory cell transistor (Ma1) in the form of a tunnel current. In this case, the absolute value of the other potential (−10 V) of the word line drive signal (WDP) is set to be several times (about two to five times) the absolute value of one potential (+3 V). The ratio of the other potential to one potential is properly determined in accordance with each embodiment of the present invention. In addition, the number of times the word line drive signal (WDP) oscillates is properly determined in accordance with each embodiment. Furthermore, the AC waveform of the word line drive signal (WDP) is not limited to a specific shape such as a rectangular shape, and signals having various waveforms such as a sine wave, a triangular wave, and a sawtooth wave can be used as word line drive signals (WDP).

In the manufacturing method of the present invention, which is associated with the second object, a well of a second conductivity type (n type) and a ground wiring layer of the second conductivity type (n type) are formed in a semiconductor substrate of a first conductivity type (p type); a word line region of the first conductivity type (n type) is formed in the well; an impurity (arsenic) of the second conductivity type (n type) is implanted into the semiconductor substrate to form drain and source regions near the well; and a continuous floating gate (FG) is formed on the channel region between the drain and source regions and the word line region through a predetermined gap.

In the nonvolatile semiconductor memory according to the first object of the present invention, one potential (+3 V) of the word line drive signal (WDP) is applied to the control gate of a target memory cell transistor (Ma1), and it is then checked whether the memory cell transistor is turned on by one potential (+3 V).

If the target memory cell transistor is turned on, the bit line potential drops through the drain-source path of the transistor. Thereafter, even if the other potential (−10 V) of the word line drive signal (WDP) is applied to the control gate of the memory cell transistor, no charges are removed from the floating gate of the transistor in the form of a tunnel current (prevention of an over-erased state).

If the memory cell transistor is not turned on (the threshold of the target memory cell transistor is higher than a desired value) by one potential (+3 V) of the initial word line drive signal (WDP), no drop in bit line potential occurs. When the other potential (−10 V) of the word line drive signal (WDP) is applied to the control gate immediately after the above operation, a small amount of stored charge is extracted from the floating gate of the target memory cell transistor in the form of a tunnel current. As a result, the threshold of the target memory cell transistor drops by the amount corresponding to the extracted charges.

When the memory cell transistor is not turned on (the threshold of the target memory cell transistor is higher than the desired value) even after one potential (+3 V) of the word line drive signal (WDP) is applied to the memory cell transistor whose threshold has dropped to some degree, no drop in bit line potential occurs. When the other potential (−10 V) of the word line drive signal (WDP) is applied to the control gate immediate after the above operation, stored charges are extracted from the floating gate of the target memory cell transistor again in the form of a tunnel current. As a result, the threshold of the target memory cell transistor further drops by the amount corresponding to the extracted charges.

If the memory cell transistor is turned on (i.e., the threshold of the target memory cell transistor drops to the desired value) after one potential (+3 V) of the word line drive signal (WDP) is applied to the memory cell transistor whose threshold has dropped further, the bit potential drops through the drain-source path of the target memory cell transistor in an ON state. Thereafter, even if the other potential (−10 V) of the word line drive signal (WDP) is applied to the control gate of the memory cell transistor, no charges are removed from the flowing gate in the form of a tunnel current (prevention of an over-erased state). At this time, the target memory cell transistor has undergone an erase operation to be accurately set to a desired threshold without causing an over-erased state (achievement of the first object).

According to the present invention, since all the thresholds of many memory cell transistors constituting a nonvolatile semiconductor memory can be caused to converge to a desired value (+2.5 V) corresponding to one potential (+3 V) of the word line drive signal (WDP), the width of variations in threshold of the respective memory cell transistors is very small (⅓ or less that in the prior art).

In the manufacturing method of the present invention, which is associated with the second object, a floating gate is formed on a channel region and a control gate region, unlike the conventional process of forming a floating gate on the channel region of a memory cell transistor and further forming a control gate on the floating gate. According to the manufacturing method of the present invention, therefore, the number of steps in the manufacturing process is decreased by at least one as compared with the conventional process in which a floating gate is sandwiched by a channel region and a control gate.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 2A and 2B are timing charts for explaining the circuit operation of a word line drive pulse generator used in the device in FIG. 1, in which FIG. 2A shows the waveform of an input signal, and FIG. 2B shows the waveform of an output pulse;

FIGS. 3A and 3B are views for explaining the circuit operations of a bit line selection transistor and a memory cell transistor in the device in FIG. 1, in which FIG. 3A is a timing chart showing the waveforms of voltages used in the main part of the circuit, and FIG. 3B is an equivalent circuit diagram based on a capacitance component on a bit line and a leakage current component;

FIGS. 5A to 5F are timing charts for explaining two examples of the circuit operation of a word line drive pulse generator used in the device in FIG. 4, in which FIG. 5A shows the waveform of a first input signal in the first example, FIG. 5B shows the waveform of a second input signal in the first example, FIG. 5C shows the waveform of an output pulse in the first example, FIG. 5D shows the waveform of a first input signal in the second example, FIG. 5E shows the waveform of a second input signal in the second example, and FIG. 5F shows the waveform of an output pulse in the second example;

FIGS. 8A and 8B are views showing an IC structure obtained by forming the memory cell portions in the first to fourth embodiments into an integrated circuit, in which FIG. 8A is a plan view of the IC structure, and FIG. 8B is a sectional view taken along a line 8B—8B in FIG. 8A;

FIGS. 9A to 9D are sectional views for explaining a manufacturing process for an IC having the structure shown in FIGS. 8A and 8B, in which FIG. 9A shows a cross-section of a structure obtained by forming an N well and a ground line in a P-substrate by diffusion, FIG. 9B shows a cross-section of a structure obtained by forming a P+-polysilicon layer for a word line in the N well by diffusion, FIG. 9C shows a cross-section of a structure obtained by forming the drain and source of a memory cell transistor by implanting arsenic ions into portions between the word line and the ground line, and FIG. 9D shows a cross-section of a structure obtained by forming floating gates on the drain and the source and the word line;

FIGS. 11A to 11C are graphs for explaining conventional EEPROM cell structures and the threshold distributions of the cells, in which FIG. 11A shows the threshold distribution of an offset gate type flash EEPROM, FIG. 11B shows the threshold distribution of a selfalign type flash EEPROM, and FIG. 11C shows the threshold distribution of a NAND type EEPROM.

DETAILED DESCRIPTION OF THE PREFERRED EMBODIMENTS

The arrangement and operation of a nonvolatile semiconductor memory (EEPROM) of the present invention will be described below with reference to the accompanying drawings.

Figure 1:
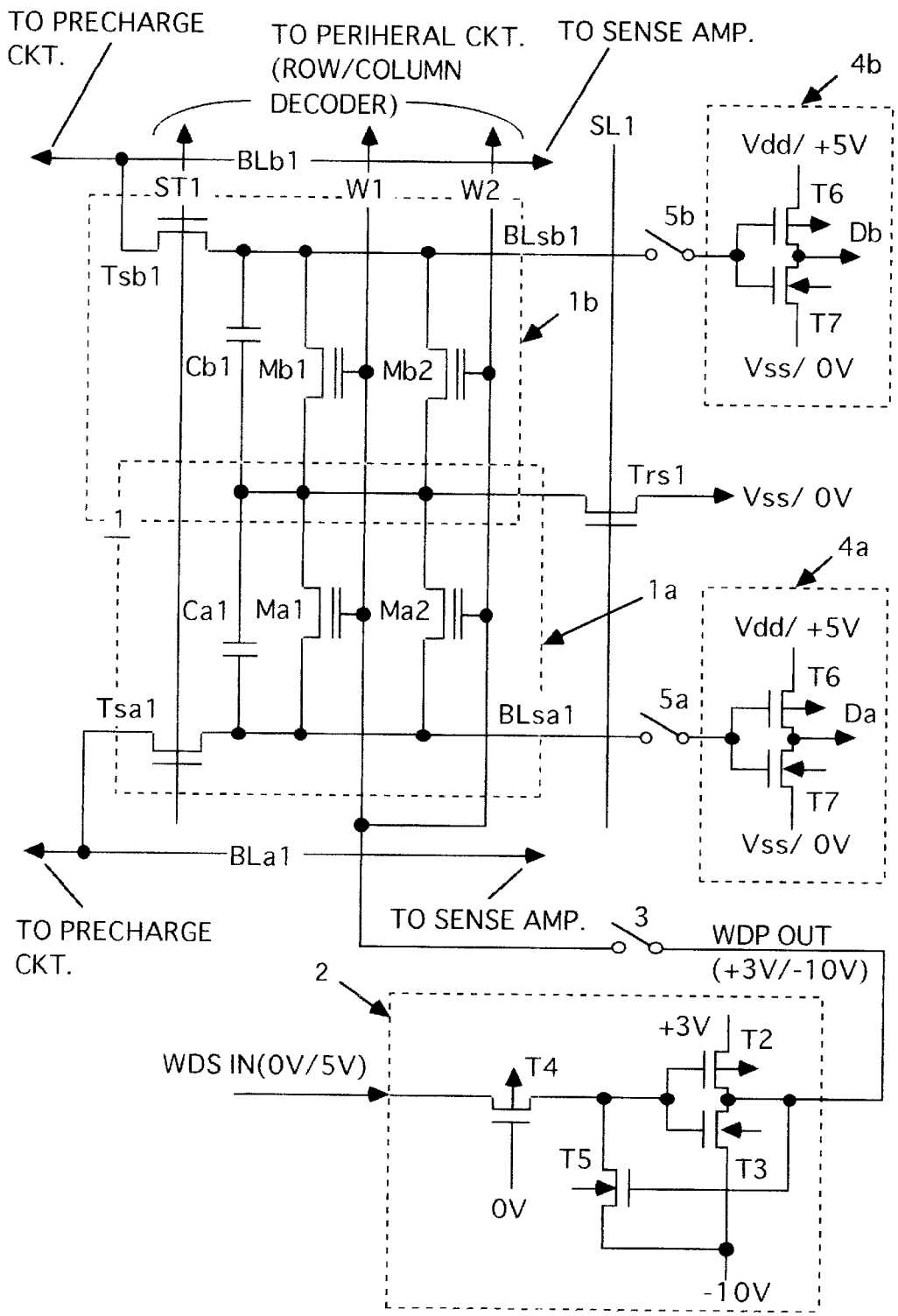
FIG. 1 is a circuit diagram for explaining the arrangement of a nonvolatile semiconductor memory according to an embodiment of the present invention.

FIG. 1 is a circuit diagram showing the main part of an EEPROM according to an embodiment of the present invention. Referring to FIG. 1, memory cell array 1 includes bit line selection transistor Tsa1 for selectively connecting main bit line BLa1 to sub bit line BLsa1, nonvolatile memory cell transistors Ma1 and Ma2 whose drains are connected to sub bit line BLsa1, and bit line capacitor Ca1 connected between sub bit line BLsa1 and a common source circuit for non-volatile memory cell transistors Ma1 and Ma2. Each of nonvolatile memory cell transistors Ma1 and Ma2 has an n-channel MOS transistor structure having a control gate and a floating gate. Nonvolatile charge information is held in the floating gate of each nonvolatile memory cell transistor.

In this case, a sub bit line is a conductive line connected to the drain (or source) of a memory cell transistor, and a main bit line is a conductive line connected to a sub bit line via a switch means.

Memory cell array 1 further includes bit line selection transistor Tsb1 for selectively connecting main bit line BLb1 to sub bit line BLsb1, nonvolatile memory cell transistors Mb1 and Mb2 whose drains are connected to sub bit line BLsb1, and bit line capacitor Cb1 connected between sub bit line BLsb1 and a common source circuit for nonvolatile memory cell transistors Mb1 and Mb2. Each of nonvolatile memory cell transistors Mb1 and Mb2 has a control gate and a floating gate. Nonvolatile charge information is held in the floating gate of each nonvolatile memory cell transistor.

The common source circuits for memory cell transistors Ma1, Ma2, Mb1, and Mb2 are selectively connected to a ground circuit (or a negative power supply Vss/0 V circuit) via source-side selection transistor Trs1.

Bit line selection gate line ST1 is connected to the gates of bit line selection transistors Tsa1 and Tsb1, and source-side selection gate line SL1 is connected to the gate of source-side selection transistor Trs1. Word line W1 is connected to the gates of memory cell transistors Ma1 and Mb1, and word line W2 is connected to the gates of memory cell transistors Ma2 and Mb2.

The arrangement of each of the memory cell transistors (Ma1 to Ma2/Mb1 to Mb2) will be described in detail.

The floating gate has a size of $3\,\mu m \times 1\,\mu m$ and is in contact with portions of the channel and the source/drain through the gate oxide film.

The channel has a size of $1\,\mu m \times 1\,\mu m$. The gate oxide film has a thickness of 10 nm.

The insulating film between the floating gate and the control gate is constituted by an ONO film (silicon oxide film/silicon nitride film/silicon oxide film) having a thickness of 15 nm figured out as the thickness of the silicon oxide film.

Bit line selection transistor Tsa1, memory cell transistors Ma1 and Ma2, and bit line capacitor Ca1 constitute memory cell block 1a. Bit line selection transistor Tsb1, memory cell transistors Mb1 and Mb2, and bit line capacitor Cb1 constitute memory cell block 1b.

Referring to FIG. 1, for the sake of easy understanding, each memory cell block includes two memory cell transistors (Ma1 and Ma2 or Mb1 and Mb2). In practice, however, the number of memory cell transistors constituting each memory cell block can be increased (e.g., 256 to 1024 memory cell transistors per block). In this case, the number of word lines (W1 and W2) increases in accordance with the actual number of memory cell transistors.

Memory cell block 1a has a DRAM function using a synthetic capacitance (bit line equivalent capacitance Co: about 100 fF to 300 fF) consisting of the capacitance of bit line capacitor Ca1 and the stray capacitance (parasitic capacitance) of sub bit line BLsa1 as an information storage means. That is, information can be stored in capacitance Co of sub bit line BLsa1 according to the same operation principle of the DRAM by charging the bit line equivalent capacitance Co with the voltage of main bit line BLa1 when bit line selection transistor Tsa1 is turned on, and periodically refreshing the voltage of charged capacitance Co.

Memory cell block 1b has a DRAM function using a synthetic capacitance (bit line equivalent capacitance Co of about 100 fF to 300 fF) of the capacitance of bit line capacitor Cb1 and the stray capacitance of sub bit line BLsb1 as an information storage means. That is, information can be stored in capacitance Co of sub bit line BLsb1 according to the same operation principle of the DRAM by charging the bit line equivalent capacitance Co with the voltage of main bit line BLb1 when bit line selection transistor Tsb1 is turned on, and periodically refreshing the voltage of charged capacitance Co.

When the arrangement shown in FIG. 1 is regarded as a DRAM using bit line equivalent capacitance Co of sub bit line BLsa1 (BLsb1) as a memory cell capacitor as described above, main bit line BLa1 (BLb1) corresponds to a bit line of the DRAM, and bit line selection gate line ST1 corresponds to a word line of the DRAM.

The above DRAM structure of main bit line BLa1 serves as a write buffer which operates at a high speed relative to memory cell block 1a serving as an EEPROM. The above DRAM structure of main bit line BLb1 serves as a write buffer which operates at a high speed relative to memory cell block 1b serving as an EEPROM.

As memory elements decrease in size with advances in semiconductor manufacturing techniques, the value of the stray capacitance (the value of the parasitic capacitance between the sub bit line and the semiconductor region in which the sub bits line is formed) of sub bit line BLsa1/BLsb1 tends to decrease. If 100 to 300 fF or more can be ensured as the sum of such stray capacitances and the capacitances between the drains and sources of many memory cell transistors (Ma1 and Ma2/Mb1 and Mb2), capacitors Ca1 and Cb1 can be omitted.

FIG. 1 shows part of the arrangement of the EEPROM. An actual memory cell array includes many main/sub bit lines, word lines, selection gate lines, selection transistors, memory cell transistors, and the like. These memory cell transistors are arranged in the form of a matrix. Row and column decoder circuits (peripheral circuits) for specifying a predetermined memory cell in accordance with an external address input are connected to this memory cell matrix. A bit line precharge circuit and a sense amplifier for reading stored data from a specified memory cell transistor are connected to each of a plurality of main bit lines. The arrangements of these row and column decoder circuits, precharge circuits, and sense amplifiers in a general DRAM are known.

Sub bit line BLsa1 is connected to charge extraction completion detector 4a via switch circuit 5a, and sub bit line BLsb1 is connected to charge extraction completion detector 4b via switch circuit 5b. Each of charge extraction completion detectors 4a and 4b is constituted by a CMOS inverter having p-channel MOS transistor T6 on the positive power supply Vdd (e.g., +5 V) side, and n-channel MOS transistor T7 on the negative power supply Vss (0 V).

Charge extraction completion detector 4a generates output Da of Vss level (=0 V) if the potential of sub bit line BLsa1 is higher than the gate threshold (e.g., +2.5 V) of n-channel MOS transistor T7 when switch circuit 5a is closed, and generates output Da of the Vdd level (=5 V) if the potential of sub bit line BLsa1 is lower than the gate threshold (e.g., 5 V−2.5 V=+2.5 V)) of p-channel MOS transistor T6 when switch circuit 5a is closed.

In other words, when output Da from charge extraction completion detector 4a is at Vss level (=0 V), extraction of the charges from the floating gate of target memory cell transistor Ma1 (or Ma2) connected to sub bit line BLsa1 is not completed. When output Da changes to the Vdd level (=5 V), the completion of extraction of the charges from the floating gate of target memory cell transistor Ma1 (or Ma2) connected to sub bit line BLsa1 is detected.

Similarly, when output Db from charge extraction completion detector 4b is at the Vss level (=0 V), extraction of the charges from the floating gate of target memory cell transistor Mb1 (or Mb2) connected to sub bit line BLsb1 is not completed. When output Db changes to the Vdd level (=5 V), the completion of extraction of the charges from the floating gate of target memory cell transistor Mb1 (or Mb2) connected to sub bit line BLsb1 is detected.

Word lines W1 and W2 are commonly connected to the output circuit of word line drive pulse generator 2 via word line switch circuit 3. Word line drive pulse generator 2 comprises a CMOS inverter (p-channel transistor T2+n-channel transistor T3) connected to a positive power supply of, e.g., +3 V and a negative power supply of, e.g., −10 V, a normally ON p-channel transistor T4 (which becomes a selection transistor if its gate potential is controlled) on the input side, and n-channel transistor T5 for positively feeding back an output from the CMOS inverter to the input side.

Word line drive pulse generator 2 generates pulse output WDPOUT whose potential changes between, for example, +3 V and −10 V in accordance with the signal potential of input WDSIN whose potential changes between 0 V and +5 V.

Figure 2A:
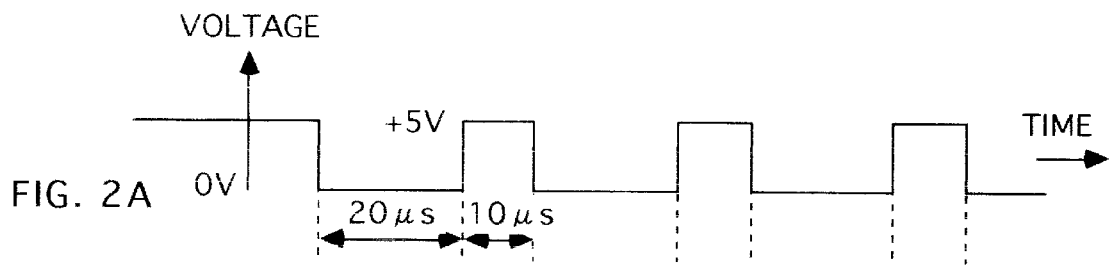
Figure 2B:
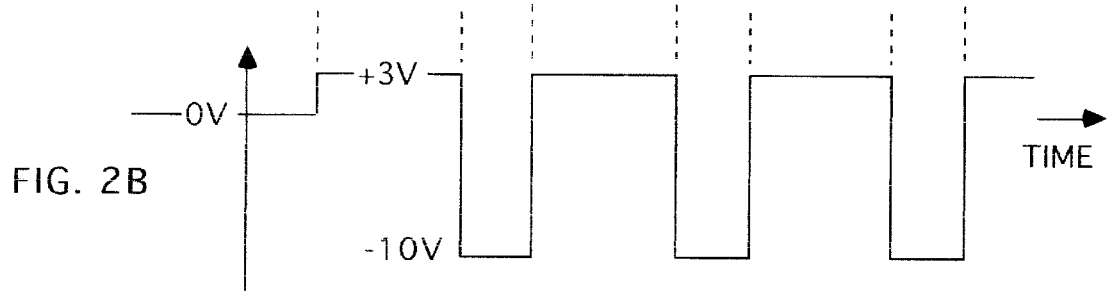

Upon reception of word line drive signal input WDSIN having the waveform shown in FIG. 2A, word line drive pulse generator 2 generates word line drive pulse output WDPOUT having the waveform shown in FIG. 2B. Circuit 2 has a level shifting function of changing a pulse of 0 V/+5 V like the one shown in FIG. 2A to a pulse of +3 V/−10 V like the one shown in FIG. 2B.

When word line switch circuit 3 is turned on, word line drive pulse output WDPOUT of +3 V/−10 V like the one shown in FIG. 2B is supplied to word lines W1 and W2. With this operation, all the memory cell transistors whose control gates are connected to word lines W1 and W2 (i.e., the memory cell transistors each having a drain to which a sufficient sub bit line potential is applied) can be set to a predetermined threshold to perform a batch erase operation by word line drive pulse output WDPOUT of +3 V/−10 V (a batch erase flash EEPROM operation to be performed for all the bits or a memory block at a time).

Figures 3A, 3B:
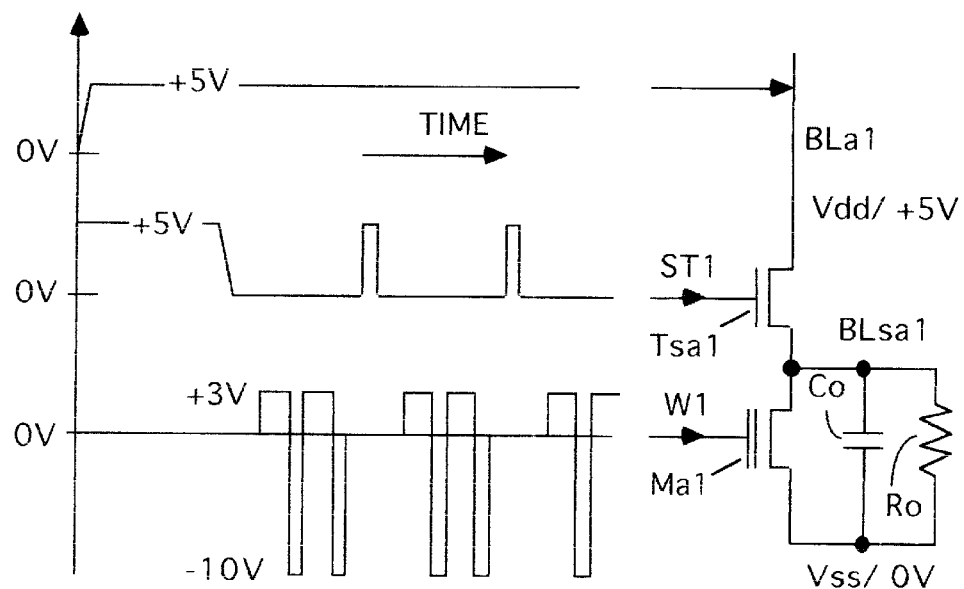

The circuit operations (erase/leakage current compensation) of bit line selection transistor Tsa1 and memory cell transistor Ma1 of the EEPROM shown in FIG. 1 will be described with reference to FIGS. 3A and 3B. FIG. 3B shows a simplified circuit of the memory arrangement shown in FIG. 1. FIG. 3A shows the waveform of a voltage applied to each component.

Referring to FIG. 3B, main bit line BLa1 is connected to the drain of n-channel MOS memory cell transistor Ma1 via the drain-source path of bit line selection transistor Tsa1, and bit line equivalent capacitance Co and leakage current component equivalent resistance Ro are connected in parallel between the drain and source of transistor Ma1.

In this case, bit line equivalent capacitance Co exhibits the synthetic value of the stray capacitance of sub bit line BLsa1 and the capacitance of bit line capacitor Ca1, and leakage current component equivalent resistance Ro exhibits the value of a path through which a current leaks from sub bit line BLsa1 into the source circuit (Vss/0 V) of memory cell transistor Ma1. Assume that bit line equivalent capacitance Co is about 1 pF, and leakage current component equivalent resistance Ro is about 1,000 MΩ.

An erase operation (see FIG. 11B) will be described, provided that threshold voltage VTH of nonvolatile memory cell transistor Ma1 is 6.5 V or more at first.

When a potential of +5 V like the one shown at the upper portion in FIG. 3A is applied to main bit line BLa1 while a potential of +5 V like the one shown at the intermediate left portion in FIG. 3A is applied to bit line selection gate line ST1, transistor Tsa1 is turned on, and sub bit line BLsa1 is precharged to almost +5 V (a reference potential, 0 V=Vss, is set in the source circuit of memory cell transistor Ma1).

When the potential of bit line selection gate line ST1 is lowered to 0 V after the above operation as indicated by the intermediate left portion near the center in FIG. 3A, transistor Tsa1 is turned off, and sub bit line BLsa1 is electrically disconnected from main bit line BLa1 to be set in a floating state. In this state, the precharge potential of +5 V of sub bit line BLsa1 is maintained by the charges stored in bit line equivalent capacitance Co as a small capacitance (1 pF).

Subsequently, a word line drive pulse like the one shown at the lower left portion near the center in FIG. 3A is applied to the control gate of memory cell transistor Ma1 via word line W1. As this pulse, output WDPOUT from word line drive pulse generator 2 in FIG. 1 is used. In this case, the interval (0 V interval) during which the word line drive pulse shown at the lower portion in FIG. 3A is not generated is the interval during which word line switch circuit 3 in FIG. 1 is kept off. In the interval during which this pulse is generated, word line switch circuit 3 is kept on.

When word line switch circuit 3 is turned on, a voltage of +3 V is applied to the control gate of memory cell transistor Ma1 for a short period of time (e.g., 20 μs). However, since threshold voltage VTH is assumed to be 6.5 V or more at first, transistor Ma1 is kept off. At this point, if a drop in sub bit line potential due to a leakage current flowing via leakage current component equivalent resistance Ro can be still regarded as a negligible state, the floating state (+5 V) of sub bit line BLsa1 can be maintained.

When a word line drive pulse of –10 V is applied to the control gate of memory cell transistor Ma1 for a short period of time (e.g., 10 μs), a tunnel current flows between the floating gate and drain of memory cell transistor Ma1 whose drain is precharged to +5 V. With this tunnel current, some of the charges in the floating gate are extracted. As a result, threshold voltage VTH of memory cell transistor Ma1 drops to some degree.

Even if threshold VTH of memory cell transistor Ma1 drops to some degree, memory cell transistor Ma1 is not turned on as long as threshold voltage VTH is higher than +3 V equal to the voltage of the word line drive pulse.

Even in the interval during which memory cell transistor Ma1 is kept off, if a sufficient precharge potential is applied to the drain, charges are extracted from the floating gate little by little in the form of a tunnel current every time a word line drive pulse of –10 V is applied. As a result, threshold voltage VTH gradually drops.

The charge voltage (sub bit line precharge potential) of bit line equivalent capacitance Co drops with time owing to a tunnel current flowing in the floating gate of memory cell transistor Ma1 and a leakage current flowing in leakage current component equivalent resistance Ro. If this precharge potential excessively drops (i.e., the drain voltage of memory cell transistor Ma1 excessively drops), no tunnel current flows in the floating gate even if a voltage of –10 V is applied thereto. In such a case, a gradual drop in threshold voltage VTH of transistor Ma1 stops before the voltage reaches a desired value (e.g., +2.5 V) corresponding to +3 V of the word line drive pulse.

In order to prevent a drop in the sub bit line precharge potential, according to the arrangement shown in FIGS. 3A and 3B, bit line selection transistor Tsa1 is intermittently and instantaneously turned on in the interval during which word line drive pulse output WDPOUT is applied to word line W1, thereby injecting a small amount of charge from main bit line BLa1 into sub bit line BLsa1 in a floating state.

More specifically, word line switch circuit 3 in FIG. 1 is turned off in accordance with the timing at which the potential of sub bit line BLsa1 in the floating state drops to some degree, and the application of word line drive pulse output WDPOUT to word line W1 is interrupted (for a period equal to or shorter than one period, 30 μs, of pulse WDPOUT, e.g., 7 μs), as indicated by the lower central portion in FIG. 3A. Thereafter, as indicated by the intermediate central portion in FIG. 3A, a short pulse of 5 V (e.g., a pulse of a width 3 μs with an OFF interval of 2 μs between the adjacent pulses) is applied to bit line selection transistor Tsa1 to instantaneously turn it on in the interval (7 μs) during which word line drive pulse output WDPOUT is not generated, thereby restoring sub bit line BLsa1, whose potential has dropped, to the precharge state corresponding to +5 V.

With a combination of the pulses indicated by the intermediate and lower portions in FIG. 3A described above, the potential (about +5 V) of sub bit line BLsa1 in a floating state is ensured even if a bit line leakage current flows. With this operation, by repeatedly applying word line drive pulse output WDPOUT of –10 V, charges are extracted from memory cell transistor Ma1 in the floating gate little by little.

When threshold voltage VTH of memory cell transistor Ma1s drops to a desired value (+2.5 V) as a result of the extraction of the charges, memory cell transistor Ma1 is turned on by word line drive pulse output WDPOUT of +3 V, and the potential of sub bit line BLsa1 drops to 0 V. Subsequently, the extraction of charges from the floating gate of memory cell transistor Ma1 is stopped, and threshold voltage VTH of memory cell transistor Ma1 is accurately set to a desired value, i.e., +2.5 V (corresponding to the erased state of memory cell transistor Ma1).

The completion of the erase operation of memory cell transistor Ma1 is detected (Da="1") by charge extraction completion detector 4a shown in FIG. 1 and connected to sub bit line BLsa1. After the completion of the erase operation is detected, the application of the pulse having a width of 3 μs and indicated by the intermediate central portion in FIG. 3A is also stopped.

If the above erase operation is simultaneously performed with respect to all the memory cell transistors (Ma1 and Ma2) of memory cell block 1a, a batch erase operation (flash erase operation) in units of blocks can be realized. If this erase operation is simultaneously performed with respect to all the memory cell blocks, a batch erase operation in units of memory chips can be realized. If this erase operation is sequentially performed for each memory cell transistor, an erase operation in units of bits can be realized.

In any of the erase operations, the potential of a sub bit line is kept at a predetermined value (about +5 V), and extraction of charges from the floating gate of each memory cell transistor is sequentially performed while the sub bit line potential is sequentially compared with a predetermined word line potential (+3 V). Therefore, threshold voltages VTH of all the memory cell transistors can be caused to accurately converge to a desired value (+2.5 V).

In addition, since this converging operation can be completed by 10 pulses of word line drive pulse output WDPOUT (a maximum of about 300 μs using pulses each corresponding to 30 μs), a flash erase operation in units of blocks or memory chips can be performed at a high speed (within 300 μs).

A mechanism for preventing an over-erased state when threshold voltage VTH of memory cell transistor Ma1 is lower (e.g., +2 V) than the desired value will be described next.

First of all, similar to the case wherein threshold voltage VTH is higher than the desired value, potential Vss of the source line of memory cell transistor Ma1 is set to the ground potential, i.e., 0 V, and bit line selection transistor Tsa1 is turned on to precharge the potential of sub bit line BLsa1 to +5 V. Thereafter, bit line selection transistor Tsa1 is turned off to set sub bit line BLsa1 in a floating state corresponding to +5 V. In this case, bit line equivalent capacitance Co is in a charged state.

Subsequently, a word line drive pulse like the one indicated by the lower portion in FIG. 3A is applied to word line W1. Since the drain of memory cell transistor Ma1, whose threshold voltage VTH is lower (+2 V) than the desired value, is set at the sub bit line precharge voltage (+5 V), when a pulse of +3 V is applied to the control gate, memory cell transistor Ma1 is turned on. As a result, a channel current flows between the drain and source of this memory cell transistor, and bit line equivalent capacitance Co is discharged, leading to a drop in drain voltage. In this state, even if a pulse of −10 V is applied to the control gate of memory cell transistor Ma1, no tunnel current flows between the floating gate and the drain. For this reason, charges are not extracted any more from the floating gate of memory cell transistor Ma1 whose initial threshold voltage VTH is low, thus preventing an over-erased state.

Assume that 10 pulses of word line drive pulse output WDPOUT are applied to a memory cell transistor, whose threshold voltage VTH (+2 V) is lower than the desired value (+2.5 V), after data "0" is written, and charges are injected into the floating gate to raise threshold voltage VTH (+6.5 V or more). In this case, threshold voltage VTH converges to the desired value (+2.5 V).

As described above, in the EEPROM of the present invention, threshold voltage VTH of a memory cell transistor whose initial threshold voltage VTH is higher than the desired value is caused to converge to the desired value, and no charges are extracted from the floating gate of a memory cell transistor whose initial threshold voltage VTH is lower than the desired value.

With this operation, even if a plurality of memory cell transistors exhibiting variations in threshold voltage VTH are subjected to a batch erase operation, no memory cell undergoes an over-erased state, and threshold voltages VTH of almost all the memory cell transistors can be caused to accurately converge to the desired value. The present invention, therefore, does not require a time-consuming operation of "matching the thresholds of nonvolatile memories by a write operation before an erase operation" in the prior art.

In the above description, write threshold Vth=2.5 V is set for word line voltage VW=3 V. However, different thresholds can also be set. For example, Vth=3.7 V for VW=3 V; Vth=3.0 V for VW=2 V; and Vth=2.3 V for VW=1 V.

Incidentally, the bit line connected to the memory cell transistor to which word line drive pulse WDPOUT is to be applied is set to a floating state (e.g., a precharged state at +5V) before the memory cell transistor receives word line drive pulse WDPOUT. When the bit line is set to the floating state in this case, the gate threshold Vth of this memory cell transistor will be converged to a specific value (e.g., Vth=3.7 V for VW=3 V) corresponding to the one potential (e.g., +3V) of word line drive pulse WDPOUT.

More specifically, an "automatic adjusting function of threshold voltage(s)" of memory cell transistor(s), obtained by applying a potential-varying voltage such as an AC voltage to the gate(s) of memory cell transistor(s), suggests the following. Thus, after applying the AC voltage to the gate of one or more memory cell transistors for a predetermined period of time (or by a predetermined number of cycles), the threshold voltage of each of these memory cell transistors is automatically or primarily adjusted to a prescribed value.

For obtaining a substantially-maximum advantage of the "automatic adjusting function of threshold voltage(s)" of memory cell transistor(s), it is preferable to set the bit line to the aforementioned floating state. This, however, does not mean that the present invention excludes an embodiment wherein bit line(s) is(are) not set to the floating state. For instance, the present invention can be reduced to practice wherein bit line(s) is(are) coupled, via equivalent-high-resistance element(s) or circuit(s), to a circuit with a specific voltage potential.

In order to provide the floating state (i.e., the precharged state) of bit line(s) connected to memory cell transistor(s) (Ma1, Mb1, etc.) to which word line drive pulse(s) WDPOUT is(are) applied, specific transistor(s) (Tsa1, Tsb1, etc.) connected between the sub bit line(s) and main bit line(s) may be temporarily turned off. Or, another specific transistor (Trs1, etc.) connected between the ground circuit Vss (0V) and the common source circuit of memory cell transistors (Ma1, Mb1, etc.) may be temporarily turned off in order to obtain the above-mentioned floating state.

After the drain-side circuit (e.g., sub bit line BLsa1) of the memory cell transistor (e.g., Ma1) is precharged at, for example, +5V, this precharged circuit is set to the floating state, or to a pseudo-floating state. Here, the term "pseudo-floating state" means that the above-mentioned floating state is substantially provided for a certain short period of time. In other words, in the pseudo-floating state, the drain-side circuit (e.g., BLsa1)of the memory cell transistor (e.g., Ma1) may be connected to a given power source circuit (e.g., the Vdd circuit with +5V) via a high resistance (including an extremely-high resistance regarded as a substantially infinite resistance).

In the floating state, after the drain-side potential is once decreased, it will not be increased for a predetermined period of time.

On the other hand, in the pseudo-floating state, after the drain-side potential is once decreased, it could be increased by a negligible small amount for at least a short period of time.

The erase, write, read, and refresh operations of the DRAM type memory shown in FIG. 1 or 3B will be summarized.

[Erase Operation]

(1) The row (gate line ST1) and column (bit line BLa1/BLb1) of a DRAM cell portion including at least one target memory cell transistor (e.g., Ma1 or Ma2, or Mb1 or Mb2) to be subjected to an erase operation are designated by row and column decoders (not shown), and a selection transistor (Tsa1/Tsb1) is turned on. With this operation, the DRAM cell portion (sub bit line BLsa1/BLsb1) is precharged to +5 V.

(2) While the drain (sub bit line BLsa1/BLsb1) of at least one target memory cell transistor (Ma1 or Ma2, or Mb1 or Mb2) is precharged to +5 V, erase word line drive pulse WDPOUT like the one shown in FIG. 2B is applied to the control gate (word line W1/W2) of at least one target memory cell transistor (Ma1 or Ma2, or Mb1 or Mb2). With this operation, the threshold of each target memory cell transistor (Ma1 or Ma2, or Mb1 or Mb2) is caused to converge to the desired value (e.g., +2.5 V) (batch erase operation of all bits; flash EEPROM operation). With this batch erase operation of all the bits, for example, data "1" (corresponding to a threshold of 2.5 V) is written in each memory cell transistor.

[Write Operation (after erase operation)]

(1) The row (gate line ST1) and column (bit line BLa1) of a DRAM cell portion (bit line equivalent capacitance Co of sub bit line BLsa1) including a target memory cell transistor (e.g., Ma1) to be subjected to a write operation are designed by row and column decoders (not shown), and a selection transistor (Tsa1) is turned on (if the power supply voltage of the memory is +5 V, for example, a voltage of +7 V is applied to the gate of selection transistor Tsa1). With this operation, bit line equivalent capacitance Co of the DRAM cell portion is charged to a write data voltage (a voltage corresponding to "1" or "0"; data "1" corresponding to, e.g., 0 V, and data "0" corresponding to, e.g., +5 V).

(2) The drain (sub bit line BLsa1) of a target memory cell transistor (Ma1) is set to a write voltage (the charge voltage of bit line equivalent capacitance Co), and a high write voltage (e.g., +6 V) is applied to the control gate (word line W1) of this memory cell transistor (Ma1), thereby injecting hot electrons corresponding to the write voltage into the floating gate of the memory cell transistor (Ma1). With this operation, information is written in the target memory cell transistor (Ma1) using the DRAM cell portion (sub bit line BLsa1) as a write buffer.

More specifically, if the write data stored in bit line equivalent capacitance Co is "0" (sub bit line BLsa1=+5 V), hot electrons are injected into the floating gate of the target memory cell transistor (Ma1) to raise its threshold to, e.g., 6.5 V or more. If the write data is "1" (sub bit line BLsa1=0 V), the threshold of the target memory cell transistor (Ma1) is kept at 2.5 V as in an erase operation without injecting any hot electrons.

[Read Operation]

(1) The row (gate line ST1) and column (bit line BLa1) of a DRAM portion (equivalent capacitance Co of sub bit line BLsa1) including a target memory transistor (e.g., Ma1) to be subjected to a read operation are designated by row and column decoders (not shown), and a selection transistor (Tsa1) is turned on. With this operation, the potential of the DRAM cell portion (sub bit line BLsa1) is precharged to a low voltage (e.g., +1 to 2 V) which does not cause injection of electrons (hot electrons) into the target memory cell transistor (Ma1). For this purpose, the potential of the column (bit line BLa1) in a read operation is set to be relatively low (e.g., +2.5 V).

(2) The potential of the control gate (word line W1) of the target memory cell transistor (Ma1) is set to an intermediate potential (about +4 V) between data "0" (a threshold of +6.5 V) and data "1" (a threshold of +2.5 V).

If the data stored in the target memory cell transistor (Ma1) is "0", since the transistor (Ma1) is kept off, the potential of the DRAM cell portion (sub bit line BLsa1) is set at the preset potential (+1 to 2 V). This potential is detected by a sense amplifier (not shown) connected to sub bit line BLsa1 and is read out as data "0".

If the data stored in the target memory cell transistor (Ma1) is "1", this transistor (Ma1) is turned on (a memory cell current flows). As a result, the potential of the DRAM cell portion (sub bit line BLsa1) drops to almost 0 V. This potential of almost 0 V is detected by a sense amplifier (not shown) connected to sub bit line BLsa1 and is read out as data "1".

[Refresh Operation]

(1) The voltage information (high/low voltage) stored in bit line equivalent capacitance Co of a DRAM cell portion (sub bit line BLsa1) is periodically read out by a sense amplifier (not shown).

(2) The sense amplifier detects the high voltage information (+5 V in a write operation; +1 to 2 V in a read operation) of sub bit line BLsa1 and, at the same time, recharges sub bit line BLsa1 with the same voltage as that detected.

In the above manner, the voltage information stored in the DRAM cell portion (sub bit line BLsa1) is refreshed in a data read operation or at a predetermined refresh period (this operation is the same as that in a known DRAM). With this operation, the information (the voltage information stored in bit line equivalent capacitance Co) in the DRAM cell portion is maintained unless the information is rewritten by an external unit or the power supply of the apparatus is turned off.

Figure 4:
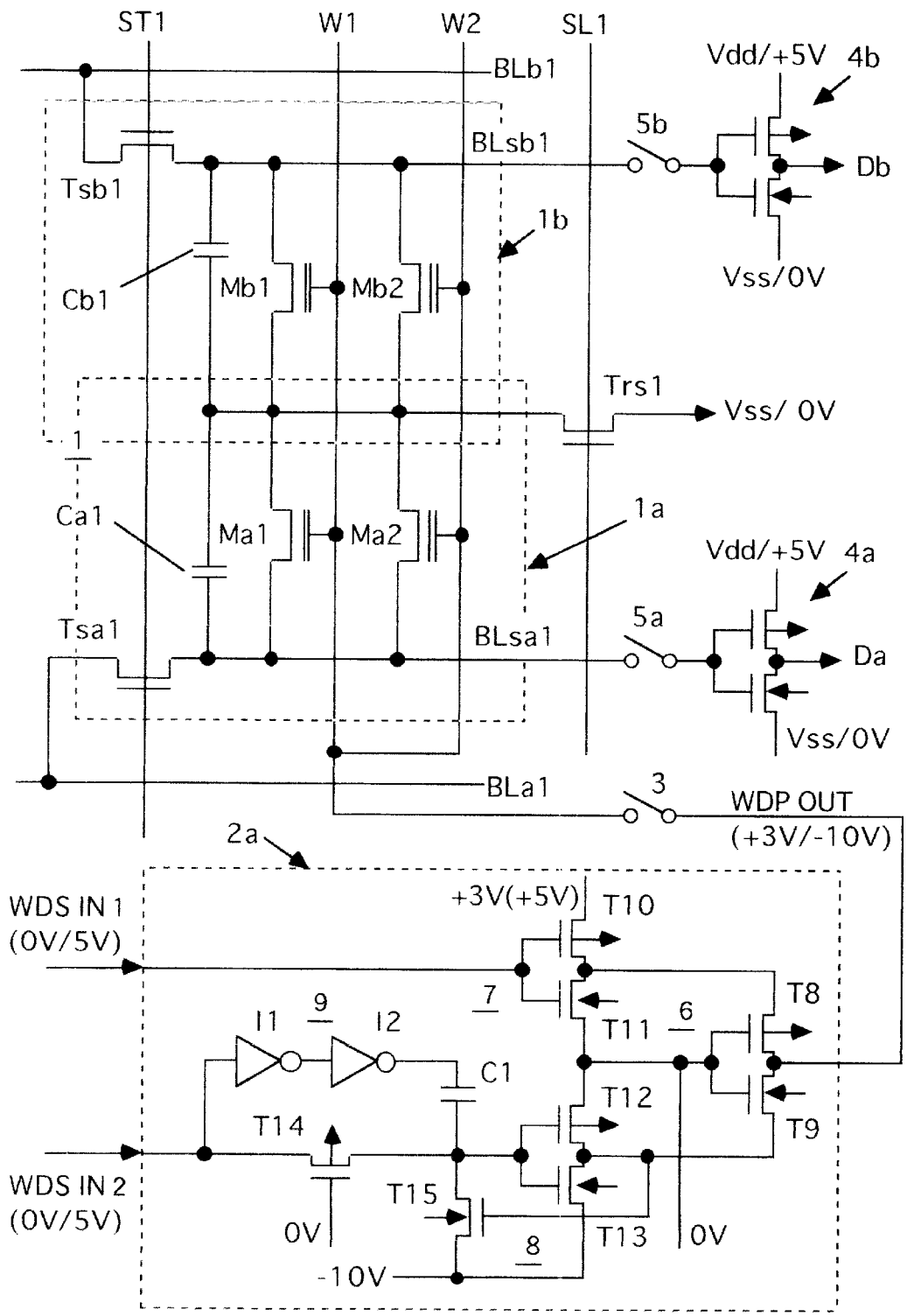
FIG. 4 is a circuit diagram for explaining the arrangement of a nonvolatile semiconductor memory according to the second embodiment of the present invention.

A nonvolatile semiconductor memory according to the second embodiment of the present invention will be described next with reference to FIG. 4. The arrangement of the embodiment shown in FIG. 4 is the same as that of the first embodiment except that a word line drive pulse generator 2a has an arrangement different from that of the word line drive pulse generator 2. For this reason, a description of identical portions will be omitted.

Word line drive pulse generator 2a comprises CMOS inverter 6 constituted by transistors T8 and T9, CMOS inverter 7 constituted by transistors T10 and T11, CMOS inverter 8 constituted by transistors T12 and T13, speed-up circuit 9 (increasing the rising/falling speed of an input pulse to CMOS inverter 8) constituted by a series circuit of inverters I1 and I2 and capacitor C1, normally ON transistor T14 (serving as a selection transistor upon control of the gate potential), and positive feedback transistor T15. The drains of transistors T11 and T12 are connected to each other and to the input terminal of CMOS inverter 6, and a voltage of 0 V is applied to the connection point thereof.

The positive power supply (the source side of p-channel MOS transistor T10) of CMOS inverter 7 is set at a voltage of +3 V (or +5 V), which corresponds to the positive pulse potential of word line drive pulse output WDPOUT. The output terminal of CMOS inverter 7 is connected to the source of p-channel MOS transistor T8.

The negative power supply (the source side of n-channel MOS transistor T13) of CMOS inverter 8 is set at a voltage of −10 V, which corresponds to the negative pulse potential of word line drive pulse output WDPOUT. The output terminal of CMOS inverter 8 is connected to the source of n-channel MOS transistor T9.

The source of n-channel MOS transistor T11 and the drain of p-channel MOS transistor T12 are connected to the input terminal of CMOS inverter 6. The output terminal of speed-up circuit 9 and the drain of n-channel MOS transistor T15 are connected to the input terminal of CMOS inverter 8, and the gate of transistor T15 is connected to the output terminal of CMOS inverter 8. The source of transistor T15 is connected to a negative power supply of −10 V.

Pulses each having a peak value of 5 V are respectively applied to the input terminals of CMOS inverters 7 and 8. A positive voltage of +3 V (or +5 V) is applied to the source of transistor T10. A negative voltage of −10 V is applied to the source of transistor T13.

Figure 5A:
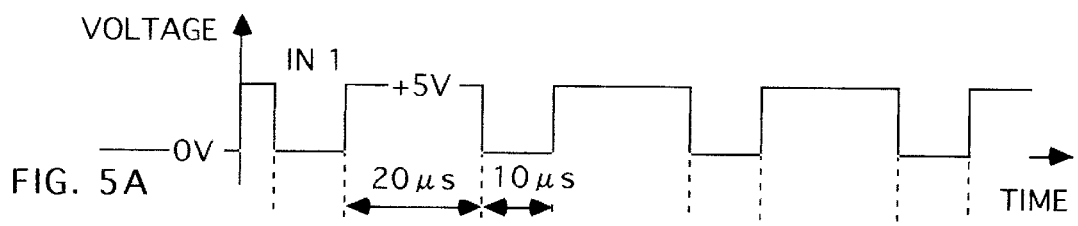
Figure 5B:
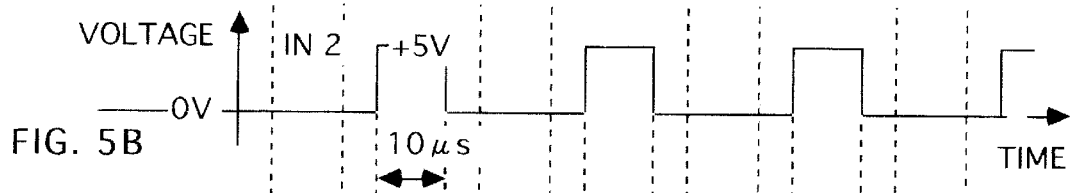
Figure 5C:
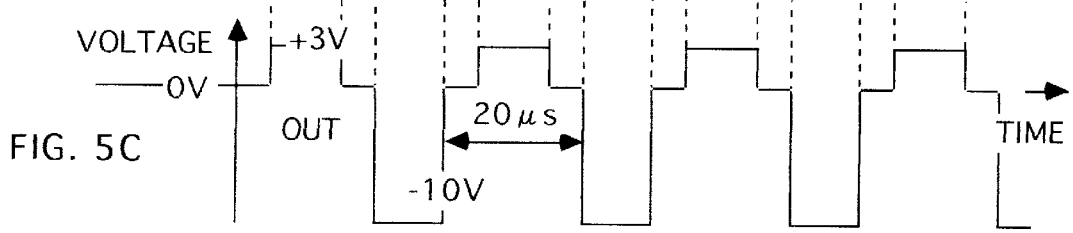

When word line drive signals WDSIN1 and WDSIN2 like those shown in FIGS. 5A and 5B are input to word line drive pulse generator 2a in FIG. 4, word line drive pulse output WDPOUT like the one shown in FIG. 5C can be obtained, provided that the positive power supply voltage of CMOS inverter 7 is +3 V.

Figure 5D:
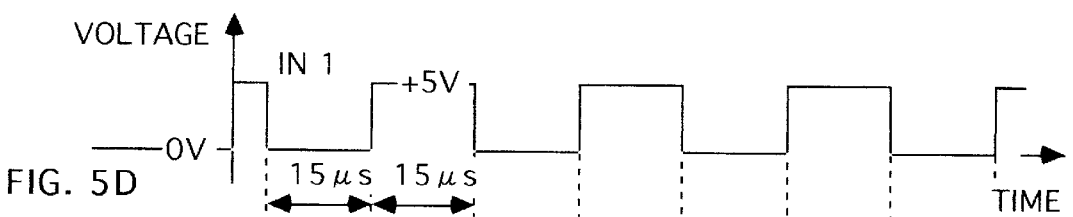
Figure 5E:
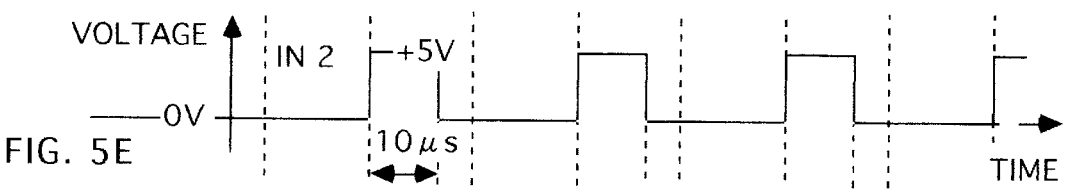
Figure 5F:
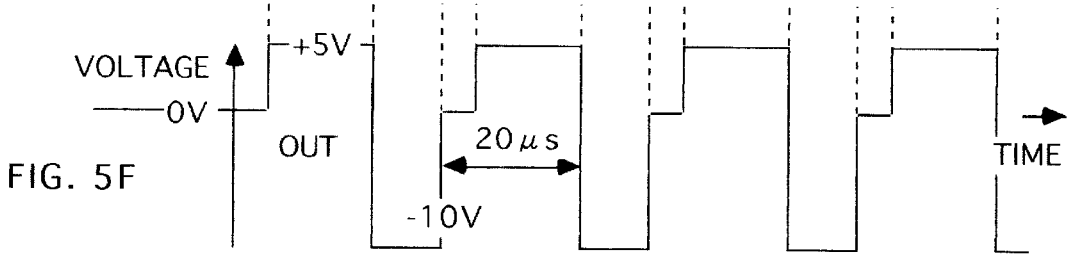

When word line drive signals WDSIN1 and WDSIN2 like those shown in FIGS. 5D and 5E are input to word line drive pulse generator 2a in FIG. 4, word line drive pulse output WDPOUT like the one shown in FIG. 5F can be obtained, provided that the positive power supply voltage of CMOS inverter 7 is +5 V.

FIGS. 5C and 5F show different waveforms of pulses WDPOUT to demonstrate variations.

If word line drive pulse output WDPOUT in FIG. 5C is applied to each of memory cell transistors Ma1 and Ma2/ Mb1 and Mb2 in FIG. 4, threshold voltage VTH of each memory cell transistor can be caused to converge to a value corresponding to the voltage, +3 V, of pulse WDPOUT while electrons are extracted little by little from the floating gate of each memory cell transistor when pulse WDPOUT is set at −10 V.

If word line drive pulse output WDPOUT in FIG. 5F is applied to each of memory cell transistors Ma1 and Ma2/ Mb1 and Mb2 in FIG. 4, threshold voltage VTH of each memory cell transistor can be caused to converge to a value corresponding to the voltage, +5 V, of pulse WDPOUT while electrons are extracted little by little from the floating gate of each memory cell transistor when pulse WDPOUT is set at −10 V.

Figure 6:
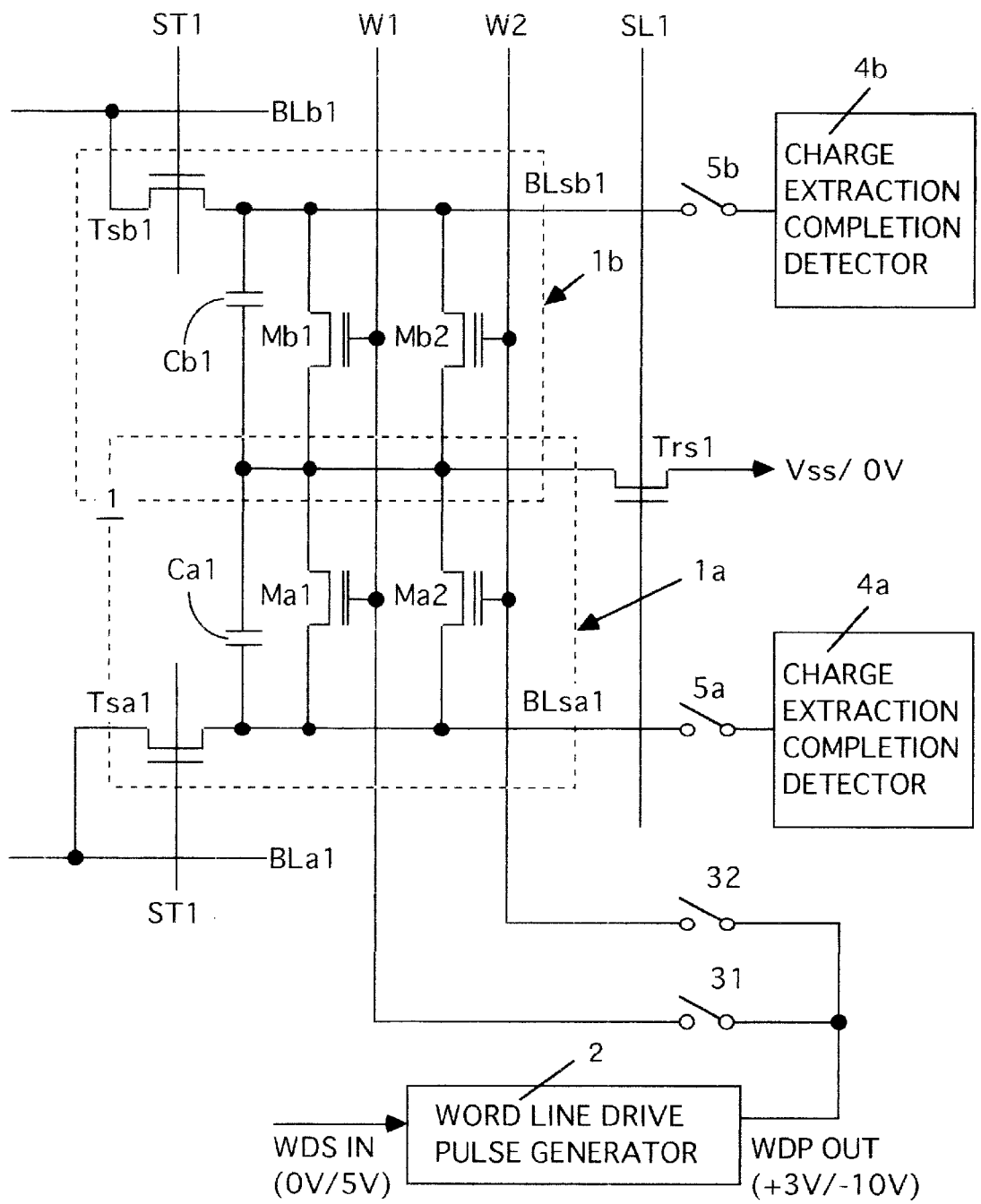
FIG. 6 is circuit diagram for explaining the arrangement of a nonvolatile semiconductor memory according to the third embodiment of the present invention.

FIG. 6 shows the arrangement of a nonvolatile semiconductor memory according to the third embodiment of the present invention, which is also a modification of the embodiment shown in FIG. 1 or 4.

The number of word line switch circuits 3 in FIG. 1 may be set to be equal to the number of memory cell transistors Ma1 and Ma2 (Mb1 and Mb2) constituting memory cell block 1a (1b), as shown in FIG. 6. If, for example, memory cell block 1a is constituted by 1,024 memory cell transistors Ma1 to Ma1024, 1,024 word line switch circuits are prepared. Alternatively, word line switch circuit 3 may be constituted by a multiplexer for sequentially connecting the output terminal of word line drive pulse generator 2 to 1,024 word lines W1 to W1024.

Referring to FIG. 6, if all word line switch circuits 31 and 32 are simultaneously turned on to simultaneously connect all the word lines to the output terminal of word line drive pulse generator 2, the data in the memory cell transistors in all the memory cell blocks can be simultaneously erased (a batch erase operation of a flash EEPROM).

If word line switch circuits 31 and 32 are turned on each at a time to connect a specific word line to the output terminal of word line drive pulse generator 2, the data in only specific memory cell transistors in each memory cell block can be erased (an erase operation in a bit unit).

Figure 7:
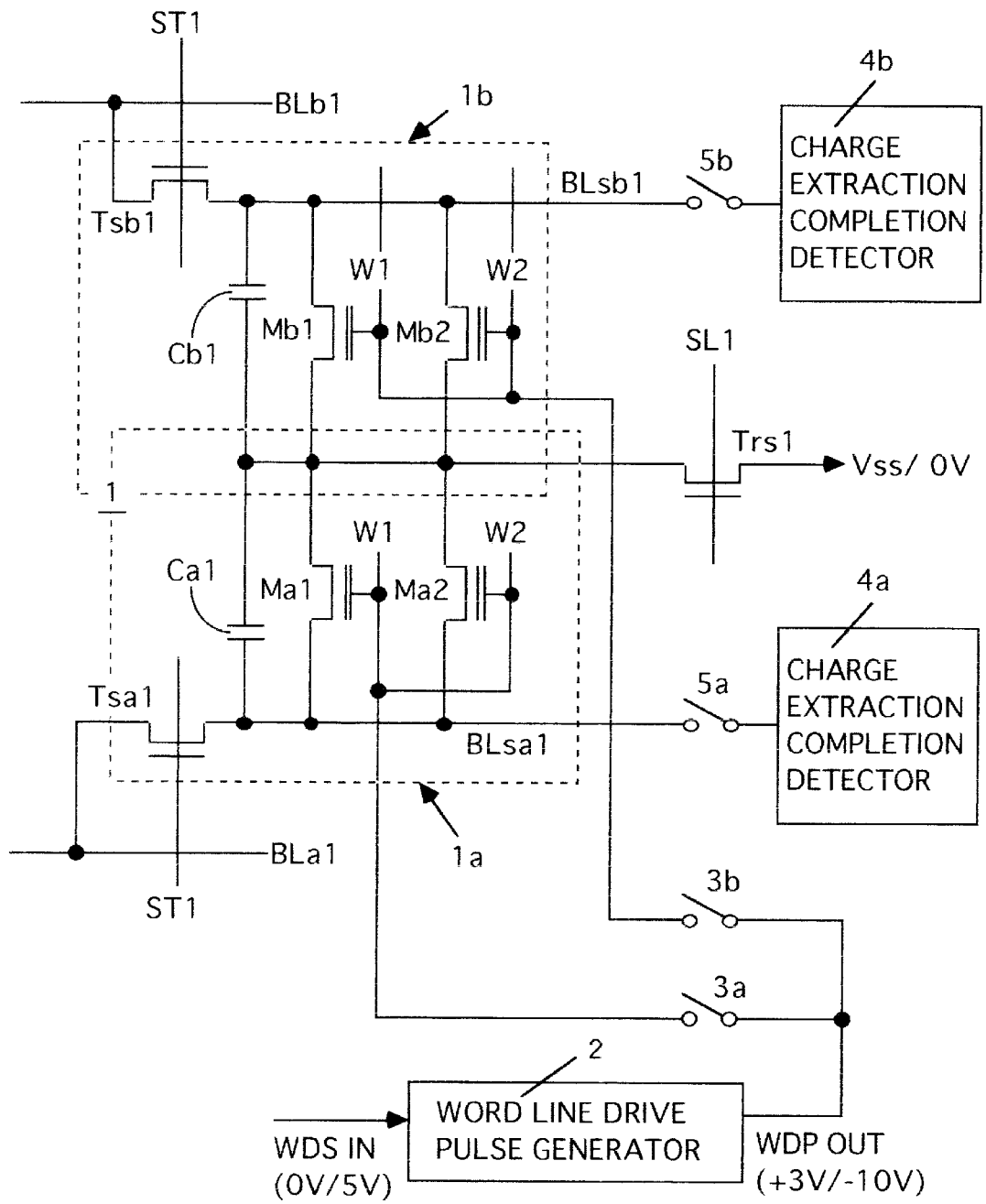
FIG. 7 is circuit diagram for explaining the arrangement of a nonvolatile semiconductor memory according to the fourth embodiment of the present invention.

FIG. 7 shows the arrangement of a nonvolatile semiconductor memory according to the fourth embodiment of the present invention, which is also a modification of the embodiment shown in FIG. 1 or 4.

The number of word line switch circuits 3 may be set to be equal to the number of memory cell blocks 1a (1b), as shown in FIG. 7. If, for example, 512 memory cell blocks are arranged, 512 word line switch circuits are prepared. Alternatively, word line switch circuit 3 may be constituted by a multiplexer for sequentially connecting the output terminal of word line drive pulse generator 2 to 512 word lines in units of blocks.

Referring to FIG. 7, if all word line switch circuits 3a and 3b are simultaneously turned on to simultaneously connect all the word lines to the output terminal of word line drive pulse generator 2, the data in the memory cell transistors in all the memory cell blocks can be simultaneously erased (a batch erase operation of a flash EEPROM).

If word line switch circuits 3a to 3b are turned on each at a time to connect the output terminal of word line drive pulse generator 2 to each word line of a specific memory cell block, the data in all the memory cell transistors in each memory cell block can be erased in units of blocks (erase operation in units of blocks.

Figure 8A:
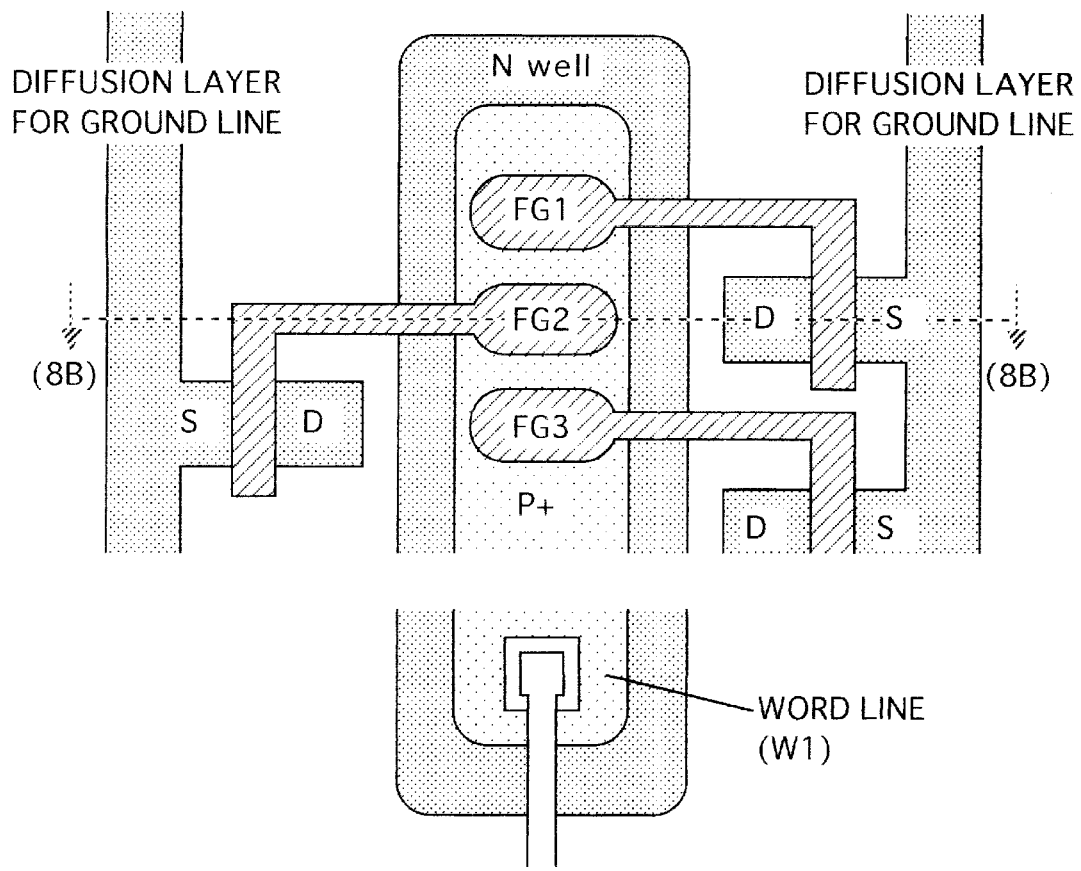
Figure 8B:
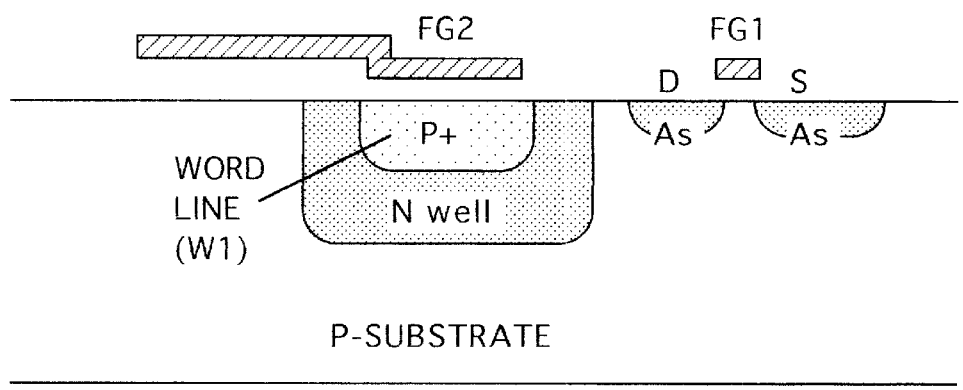

FIGS. 8A and 8B show an IC structure obtained by forming the memory cell portions in the first to fourth embodiment into an integrated circuit. FIG. 8A is a plain view of the structure. FIG. 8B is a sectional view taken along a line 8B—8B in FIG. 8A.

As shown in FIGS. 8A and 8B, an N well and N diffusion layer (ground line) are formed in a p-type semiconductor substrate. A P+-polysilicon layer is formed in the N well by diffusion. This polysilicon layer becomes a word line region also serving as the control gates of many memory cell transistors.

The source regions of many memory cell transistors are dispersed/arranged along the N diffusion layer for the ground line in contact therewith. This ground line becomes a common source circuit for many memory cell transistors.

The drain regions of the memory cell transistors are formed at positions corresponding to the respective source regions dispersed/arranged along the N diffusion layer for the ground line. The channel regions of the memory cell transistors are formed between the source and drain regions which are arranged to oppose each other. In this case, both the source and drain regions are formed by implanting arsenic ions.

Polysilicon floating gate FG is formed on the channel region and a portion of the polysilicon word line region. That is, first floating gate FG1 is formed to cover the channel region of the first memory cell transistor (e.g., memory cell transistor Ma1 in FIG. 1) and a portion of the polysilicon word line region adjacent to the transistor.

Similarly, second floating gate FG2 is formed to cover the channel region of the second memory cell transistor and a portion of the polysilicon word line region adjacent to the transistor. Third floating gate FG3 is formed to cover the channel region of the third memory cell transistor and a portion of the polysilicon word line region adjacent to the transistor.

As a result, a memory pattern having many (e.g., 512) floating gates FG extending from one long word line like the legs of a centipede is obtained. In this case, the channel regions of the respective memory cell transistors are arranged to oppose each other at the distal end portions of the legs of the centipede (the respective floating gates).

In the structure shown in FIGS. 8A and 8B, control gates need not be formed on floating gates FG. The manufacturing process is therefore simplified accordingly.

Note that each floating gate FG is slightly separated from a corresponding channel region through a silicon oxide film having a thickness of about 10 nm. The gap (10 nm) between each floating gate FG and a corresponding channel region is properly set within the range in which charges stored in floating gate FG can be extracted in the form of a tunnel current to the source region.

Word line drive pulse output WDPOUT in the embodiment shown in FIG. 1 and other embodiments is supplied to the P+-polysilicon word line region. As a result, all the thresholds of many (e.g., 512) memory cell transistors at the distal ends of the legs of the centipede converge to a value corresponding to the positive potential (e.g., +3 V) of word line drive pulse output WDPOUT.

The manufacturing process for the IC having the structure shown in FIGS. 8A and 8B will be described with reference to FIGS. 9A to 9D.

As shown in FIG. 9A, an N well and an N diffusion layer (ground line) are formed in a P-substrate. When the N well is to be formed by ion implantation, the dose is set to be, e.g., about $2\times10^{12}$ cm$^{-2}$. The acceleration voltage for ion implantation is set to be, e.g., about 140 keV. The ground line is formed by thermal diffusion of an n-type impurity such as phosphorus. In this case, heat treatment is performed in a nitrogen atmosphere at 1,150° C. for about six hours.

As shown in FIG. 9B, a p-type impurity such as boron is ion-implanted into the N well at a dose of, e.g., $5\times10^{15}$ cm$^{-2}$ and an acceleration voltage of 40 keV. After a p-type polysilicon layer (word line) is formed, a gate oxide film (silicon oxide film) having a thickness of about 10 nm is formed on the substrate.

As shown in FIG. 9C, an n-type impurity such as arsenic is ion-implanted at a predetermined position (where a memory cell transistor is to be formed) between the N well and the ground line at a dose of, e.g., $5\times10^{15}$ cm$^{-2}$ and an acceleration voltage of 100 keV.

As shown in FIG. 9D, a polysilicon layer serving as a floating gate is deposited to about 300 nm. Thereafter, the polysilicon layer is patterned into a shape like floating gate FG in FIG. 8A.

After the memory cell structure described with reference to FIGS. 8A and 8B is formed in this manner, an NSG (Undoped Silicate Glass) film having a thickness of bout 300 nm and a BPSG (Boron Phosphorus Silicate Glass) film having a thickness of about 700 nm are deposited on the resultant structure. Thereafter, contact holes are formed in the respective polysilicon word lines, and a metal wiring layer (sub bit lines, main bit lines, and the like) consisting of aluminum or the like and having a thickness of about 1 μm is formed on the resultant structure. Finally, a passivation film for element protection is formed. With this process, an IC wafer including the structure in FIGS. 8A and 8B is manufactured.

Figure 10:
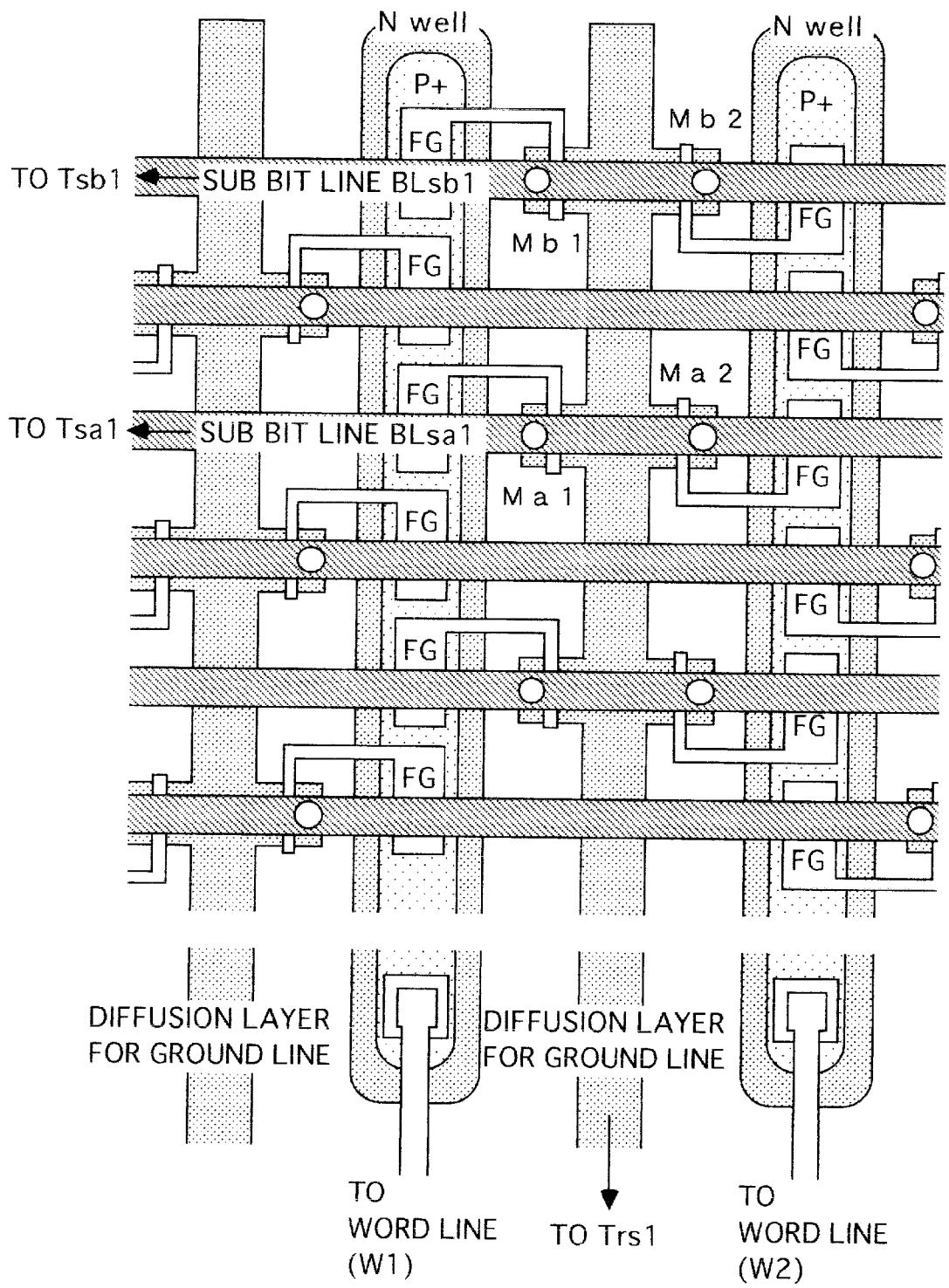
FIG. 10 is a plan view showing another IC structure obtained by forming the memory cell portions in the first to fourth embodiments into an integrate circuit.

FIG. 10 shows a modification of the structure in FIGS. 8A and 8B. As in the structure in FIGS. 8A and 8B, many floating gates formed along each long word line in the form of the feet of a centipede. However, the shape of each floating gate in the embodiment in FIG. 10 is different from that in the embodiment in FIGS. 8A and 8B. Note that FIG. 10 also shows sub bit lines extending on the drain regions of the respective memory cell transistors.

In the above embodiments (e.g., the embodiment in FIG. 1), charge extraction completion detectors (4a and 4b) are respectively arranged for sub bit lines (BLsa1 and BLsb1). However, these charge extraction completion detectors (4a and 4b) may be respectively connected to the corresponding main bit lines (BLa1 and BLb1). In this case, control must be performed to turn on bit line selection transistors (Tsa1 and Tsb1) when the completion of charge extraction is detected. In general, the number of main bit lines is much smaller than that of sub bit lines. For this reason, if charge extraction completion detectors (4a and 4b) are formed on the main bit line side, the number of charge extraction completion detectors (4a and 4b) required can be greatly decreased.

The nonvolatile semiconductor memory of the present invention is not limited to the memory cell array arrangement shown in FIG. 1. The present invention can be applied to various memory cell arrays, e.g., an array in which memory cell blocks, each consisting of many (several hundreds or more) memory cell transistors, are respectively connected to many main bit lines.

As described above, according to the nonvolatile semiconductor memory of the present invention, the different floating gate voltages of many nonvolatile memory cell transistors can be caused to converge to a predetermined potential by applying a pulse oscillating between positive and negative voltages to the floating gate of each nonvolatile memory cell transistor after the sub bit line is precharged and thereafter set in a floating state by turning off the corresponding selection transistor. That is, accurate write and erase operations can be performed with a very simple means.

In the manufacturing method of the present invention, a floating gate is formed on a channel region and a control gate region, unlike the conventional process of forming a floating gate on the channel region of a memory cell transistor and further forming a control gate on the floating gate. The number of steps in the manufacturing process is therefore decreased by at least one as compared with the conventional process in which a floating gate is sandwiched by a channel region and a control gate.

According to the manufacturing method of the present invention, although the IC chip area is slightly increased as compared with the conventional structure in which a floating gate is sandwiched between a channel region and a control gate, the manufacturing process for an EEPROM device including floating gates is simplified, and the process cost can be reduced. For these reasons, the present invention is suitable for the manufacture of a relatively small quantity of EEPROMs at a low cost with a small number of steps in the manufacturing process.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A nonvolatile semiconductor memory comprising:

a semiconductor substrate;

a well formed in said semiconductor substrate;

a word line region formed in said well;

drain and source regions formed in said semiconductor substrate at positions near said well;

first and second ground lines on two sides of said well, and a longitudinal direction of each ground line is substantially parallel to a longitudinal direction of said well;

a continuous floating gate arranged on a channel region between said drain and source regions and said word line region through a predetermined gap;

a memory cell transistor having a control gate and drain and source regions;

means for setting a bit line connected to one of the drain and source of said memory cell transistor at a floating state and precharged at a predetermined potential; and means for applying a drive signal having alternately and repeatedly vibrating potentials to the control gate of said memory cell transistor;

wherein the drive signal is independent of conventional binary data stored in said memory cell transistor.

2. A memory according to claim 1, wherein a line connecting said drain and source regions is substantially perpendicular to a longitudinal direction of said well.

3. A memory according to claim 2, further comprising:
a bit line formed above a line connecting said drain and source regions.

4. A memory according to claim 3, wherein a longitudinal direction of said word line region is substantially perpendicular to a longitudinal direction of said bit line.

5. A memory according to claim 2, further comprising:
a bit line formed above a line connecting said drain and source regions.

6. A memory according to claim 1, wherein a longitudinal direction of said word line region is substantially parallel to a longitudinal direction of said well.

7. A memory according to claim 2, wherein said floating gate has a substantially U-shaped continuous pattern extending from a predetermined position on said word line region to the channel region between said drain and source regions.

8. A memory according to claim 1, wherein said drain and source regions include a plurality of pairs of drain and source regions, said first pair of drain and source regions being formed in contact with said first ground line, and said second pair of drain and source regions being formed in contact with said second ground line, and a longitudinal direction of said first pair of drain and source regions and a longitudinal direction of said second pair of drain and source regions cross the longitudinal direction of said well.

9. A memory according to claim 8, wherein said floating gate includes a plurality of floating gates, said first floating gate having a first substantially U-shaped continuous pattern extending from a first predetermined position on said word line region to the channel region between the first pair of drain and source regions, and said second floating gate having a second substantially U-shaped continuous pattern extending from a second predetermined position on said word line region to the channel region between the second pair of drain and source regions.

10. A memory according to claim 8, wherein said floating gate includes a plurality of floating gates, said first floating gate having a first continuous pattern extending from a first predetermined position on said word line region to the channel region between the first pair of drain and source regions, and said second floating gate having a second continuous pattern extending from a second predetermined position on said word line region to the channel region between the second pair of drain and source regions.

11. A nonvolatile semiconductor memory comprising:
a semiconductor substrate;
a well formed in said semiconductor substrate;
a word line region formed in said well;
drain and source regions formed in said semiconductor substrate at positions near said well;
means for charging either one of said drain and source regions and setting the charged one in a floating state;
a continuous floating gate arranged on a channel region between said drain and source regions and said word line region through a predetermined gap;
drive signal means for supplying a drive signal to said word line region, the drive signal alternately and repeatedly having a first potential and a second potential different from the first potential;
a memory cell transistor having a control gate and drain and source regions;
means for setting a bit line connected to one of the drain and source of said memory cell transistor at a floating state and precharged at a predetermined potential; and
means for applying a drive signal having alternately and repeatedly vibrating potentials to the control gate of said memory cell transistor;
wherein the drive signal is independent of conventional binary data stored in said memory cell transistor.

12. A nonvolatile semiconductor memory comprising:
a semiconductor substrate of a first conductivity type;
a well of a second conductivity type formed in said semiconductor substrate;
a word line region of the first conductivity type formed in said well;
drain and source regions of the second conductivity type formed in said semiconductor substrate at positions near said well;
means for charging either one of said drain and source regions and setting the charged one in a floating state;
a continuous floating gate arranged on a channel region between said drain and source regions and said word line region through a predetermined gap; and drive signal means for supplying an AC pulse drive signal having a predetermined amplitude to said word line region;
a memory cell transistor having a control gate and drain and source regions;
means for setting a bit line connected to one of the drain and source of said memory cell transistor at a floating state and precharged at a predetermined potential; and
means for applying a drive signal having alternately and repeatedly vibrating potentials to the control gate of said memory cell transistor;
wherein the drive signal is independent of conventional binary data stored in said memory cell transistor.

13. A nonvolatile semiconductor memory comprising:
a semiconductor substrate;
a well formed in said semiconductor substrate;
a word line region formed in said well;
drain and source regions formed in said semiconductor substrate at positions near said well;
means for charging either one of said drain and source regions and setting the charged one in a floating state;
a continuous floating gate arranged on a channel region between said drain and source regions and said word line region through a predetermined gap; and
drive signal means for supplying a drive signal to said word line region, the drive signal alternately and repeatedly having a first potential and a second potential different from the first potential;
a memory cell transistor having a control gate and drain and source regions;
means for setting a bit line connected to one of the drain and source of said memory cell transistor at a floating state and precharged at a predetermined potential; and
means for applying a drive signal having alternately and repeatedly vibrating potentials to the control gate of said memory cell transistor;
wherein the drive signal is independent of conventional binary data stored in said memory cell transistor.

14. A nonvolatile semiconductor memory comprising:
a semiconductor substrate of a first conductivity type;
a well of a second conductivity type formed in said semiconductor substrate;
a word line region of the first conductivity type formed in said well;
drain and source regions of the second conductivity type formed in said semiconductor substrate at positions near said well;

means for charging either one of said drain and source regions and setting the charged one in a floating state at a potential higher than that of the other;

a continuous floating gate arranged on a channel region between said drain and source regions and said word line region through a predetermined gap; drive signal means for supplying an AC pulse drive signal having a predetermined amplitude to said word line region;

a memory cell transistor having a control gate and drain and source regions;

means for setting a bit line connected to one of the drain and source of said memory cell transistor at a floating state and precharged at a predetermined potential; and means for applying a drive signal having alternately and repeatedly vibrating potentials to the control gate of said memory cell transistor;

wherein the drive signal is independent of conventional binary data stored in said memory cell transistor.

15. A method of erasing data from a nonvolatile semiconductor memory produced by the process (a) forming a well of the second conductivity type and a ground layer of the second conductivity type in a semiconductor substrate of a first conductivity type;

(b) forming a word line region of the first conductivity type in said well;

(c) forming drain and source regions near said well by providing an impurity of the second impurity type into said semiconductor substrate; and (d) forming a continuous floating gate on a channel region between said drain and source regions and said word line region through a predetermined gap to form a memory cell transistor, wherein said erasing method comprises the steps of:

(a) setting a bit line connected to one of the drain and the source of said memory cell transistor at a floating state and precharging it at a predetermined potential; and (b) applying a drive signal having alternately and repeatedly vibrating potentials to the control gate of said memory cell transistor;

wherein the drive signal is independent of conventional binary data stored in said memory cell transistor.

* * * * *